(12) United States Patent
Chiu et al.

(10) Patent No.: US 8,384,174 B2
(45) Date of Patent: Feb. 26, 2013

(54) CHIP PACKAGE

(76) Inventors: Hsin-Chih Chiu, Banqiao (TW);
Chia-Ming Cheng, Taipei (TW);
Chuan-Jin Shiu, Zhongli (TW);
Bai-Yao Lou, Hsinchu (TW)

( * ) Notice: Subject to any disclaimer, the term of this patent is extended or adjusted under 35 U.S.C. 154(b) by 0 days.

(21) Appl. No.: 13/070,375

(22) Filed: Mar. 23, 2011

(65) Prior Publication Data
US 2011/0233770 A1  Sep. 29, 2011

Related U.S. Application Data

(60) Provisional application No. 61/316,668, filed on Mar. 23, 2010.

(51) Int. Cl.
*H01L 31/0203* (2006.01)
(52) U.S. Cl. ........................ 257/432; 257/433
(58) Field of Classification Search .......... 257/79, 257/431, 432, 435, 81, 99, 433, 780, 781
See application file for complete search history.

(56) References Cited

U.S. PATENT DOCUMENTS

| | | | | |
|---|---|---|---|---|
| 6,630,736 | B1 * | 10/2003 | Ignaut | 257/737 |
| 7,888,760 | B2 * | 2/2011 | Sugiyama et al. | 257/435 |
| 2005/0146051 | A1 * | 7/2005 | Jobetto | 257/780 |
| 2011/0291139 | A1 * | 12/2011 | Chiu et al. | 257/98 |
| 2011/0298000 | A1 * | 12/2011 | Liu et al. | 257/99 |
| 2012/0056226 | A1 * | 3/2012 | Hung et al. | 257/98 |
| 2012/0097999 | A1 * | 4/2012 | Chiu et al. | 257/91 |

\* cited by examiner

*Primary Examiner* — S. V. Clark
(74) *Attorney, Agent, or Firm* — Liu & Liu

(57) ABSTRACT

A chip package includes: a substrate having a first and a second surfaces; an optical device on the first surface; a conducting layer on the second surface; a passivation layer on the second surface and the conducting layer, wherein the passivation layer has an opening exposing the conducting layer; a conducting bump on the second surface and having a bottom and an upper portions, wherein the bottom portion is disposed in the opening and electrically contacts the conducting layer, and the upper portion is located outside of the opening and extends along a direction away from the opening; a recess extending from a surface of the conducting bump toward an inner portion of the conducting bump; and a light shielding layer on the second surface, extending under the upper portion, and partially located in the recess and overlapping a portion of the conducting bump.

20 Claims, 10 Drawing Sheets

A2A-2C are cross-sectional views showing the steps of forming a chip package in accordance with an embodiment of the present invention;

CHIP PACKAGE

CROSS REFERENCE TO RELATED APPLICATIONS

This Application claims the benefit of U.S. Provisional Application No. 61/316,668, filed on Mar. 23, 2010, the entirety of which is incorporated by reference herein.

BACKGROUND OF THE INVENTION

1. Field of the Invention

The present invention relates to a chip package, and in particular relates to a light sensing chip package or a light emitting chip package.

2. Description of the Related Art

Optical-electronic devices such as light sensing devices or light emitting devices play an important role in applications of image capture or lamination. These optical-electronic devices are widely used in electronic devices such as digital cameras, digital video recorders, mobile phones, solar cells, screens, lamination elements, and so on.

Along with advancements in technological development, requirements for light emitting precision of light emitting devices or light sensing precision of light sensing devices have been increased.

BRIEF SUMMARY OF THE INVENTION

According to an embodiment of the present invention, a chip package is provided, which includes: a substrate having a first surface and a second surface; an optical device disposed on the first surface of the substrate; a conducting layer located on the second surface of the substrate and electrically connected to the optical device; a passivation layer disposed on the second surface of the substrate and the conducting layer, wherein the passivation layer has an opening exposing the conducting layer; a conducting bump disposed on the second surface of the substrate and having a bottom portion and an upper portion, wherein the bottom portion of the conducting bump is disposed in the opening and electrically contacts the exposed conducting layer, and the upper portion of the conducting bump is located outside of the opening and extends along a direction away from the opening; a recess extending from a surface of the conducting bump toward an inner portion of the conducting bump; and a light shielding layer disposed on the second surface of the substrate, extending under the upper portion of the conducting bump, and partially located in the recess and overlapping a portion of the conducting bump.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

It is understood, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer, include embodiments where the first and second layers are in direct contact and those where one or more layers are interposing the first and second layers.

A chip package according to an embodiment of the present invention may be used to package a light sensing device or a light emitting device. However, embodiments of the invention are not limited thereto. For example, the chip package of the embodiments of the invention may be applied to active or passive devices, or electronic components with digital or analog circuits, such as opto electronic devices, micro electro mechanical systems (MEMS), micro fluidic systems, and physical sensors for detecting heat, light, or pressure. Particularly, a wafer scale package (WSP) process may be applied to package semiconductor chips, such as image sensor devices, light-emitting diodes (LEDs), solar cells, RF circuits, accelerators, gyroscopes, micro actuators, surface acoustic wave devices, pressure sensors, or ink printer heads.

The wafer scale package process mentioned above mainly means that after the package process is accomplished during the wafer stage, the wafer with chips is cut to obtain separate independent packages. However, in a specific embodiment, separate independent chips may be redistributed overlying a supporting wafer and then be packaged, which may also be referred to as a wafer scale package process. In addition, the above mentioned wafer scale package process may also be adapted to form chip packages of multi-layer integrated circuit devices by stacking a plurality of wafers having integrated circuits.

Figure 1A:
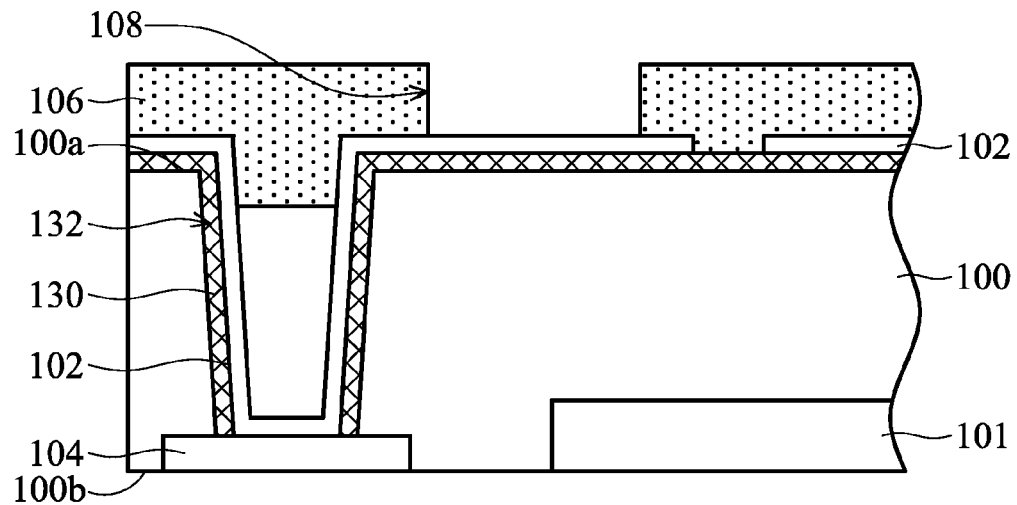
FIGS. 1A-1C are cross-sectional views showing the steps of forming a chip package in accordance with an embodiment of the present invention.
Figure 1B:
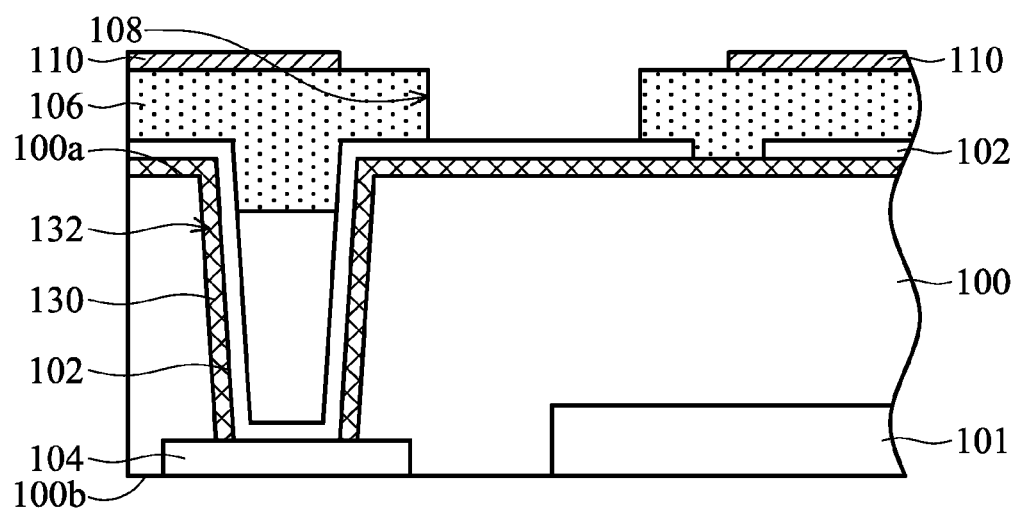
Figure 1C:
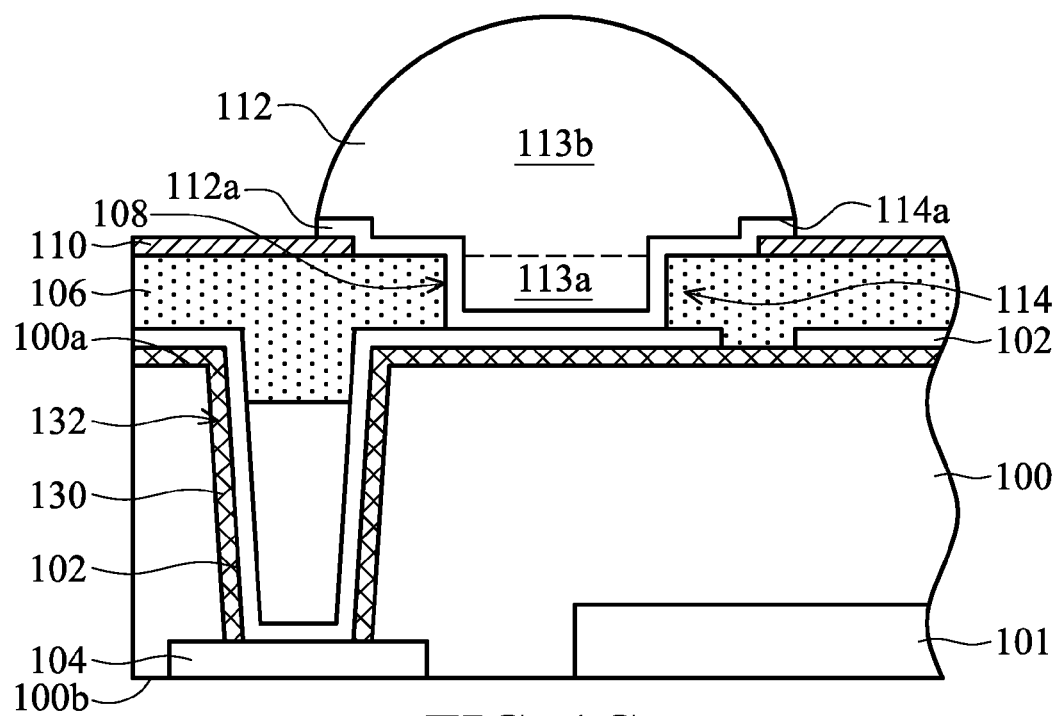

FIGS. 1A-1C are cross-sectional views showing the steps of forming a chip package according to an embodiment of the present invention. As shown in FIG. 1A, a substrate 100 is provided, which may be, for example, a semiconductor substrate or a ceramic substrate. In one embodiment, the substrate 100 is a semiconductor wafer such as a silicon wafer and a wafer-level packaging process may be performed to reduce fabrication cost and fabrication time. The substrate 100 has surfaces 100a and 100b. The surfaces 100a and 100b are, for example, opposite to each other.

As shown in FIG. 1A, in one embodiment, an optical device 101 is disposed on the surface 100b. The optical device 101 may include, but is not limited to, a light sensing device or a light emitting device. The light sensing device is, for example, a CMOS image sensor device while the light emitting device is, for example, a light emitting diode device. The optical device 101 may, for example, be electrically connected to a conducting pad structure 104 formed on the surface 100b and be electrically connected to other conducting paths through the conducting pad structure 104.

Figure 5:
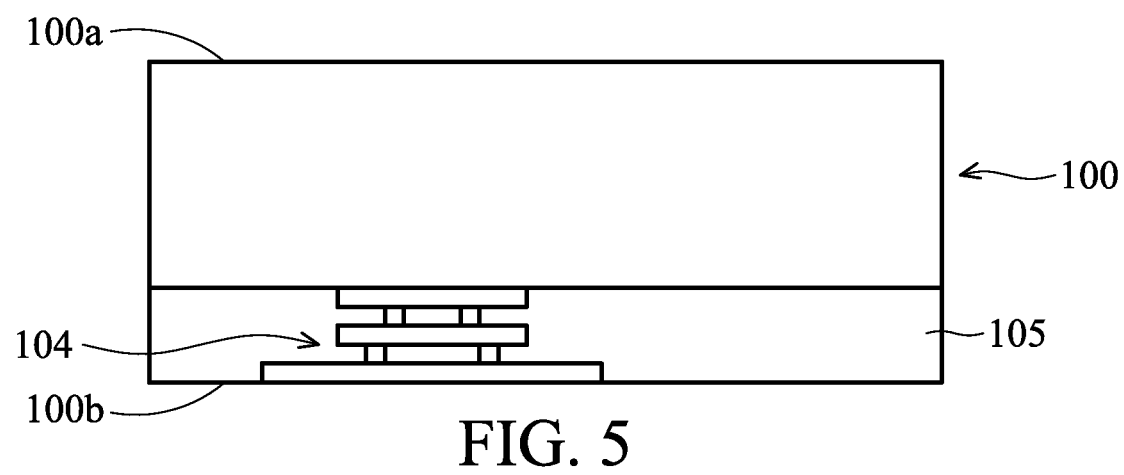
FIG. 5 is a cross-sectional view showing the conducting pad structure of a chip package in accordance with an embodiment of the present invention.

Although only a single layered conducting pad structure 104 is shown in FIG. 1A, a plurality of conducting pads may be stacked with each other or be arranged on the substrate 100. For example, in one embodiment, the conducting pad structure 104 includes a plurality of conducting pads stacked with each other, at least a conducting pad, or a conducting pad structure composed of at least a conducting pad and at least an interconnection structure. For example, referring to FIG. 5, a conducting pad structure 104 of a chip package according to an embodiment of the invention is shown. The conducting pad structure 104 has a plurality of conducting pads. These conducting pads may, for example, be formed in a dielectric layer 105 on the substrate 100 and be electrically connected to each other through interconnections formed in the dielectric layer 105. In the following description of the embodiment, for simplicity, the dielectric layer 105 and the plurality of conducting pads are not shown in the drawings. Only a single layered conducting pad structure 104 is shown in the drawings for simplicity.

As shown in FIG. 1A, a conducting layer 102 is disposed on the other surface 100a of the substrate 100. The conducting layer 102 is electrically connected to the optical device 101. For example, the conducting layer 102 may be electrically connected to the optical device 101 through the conducting pad structure 104, wherein the conducting path between the conducting layer 102 and the conducting pad structure 104 may be a through-substrate conducting structure or a redistribution layer extending on a side of the substrate 100. In the embodiment shown in FIG. 1A, a through-substrate conducting path is illustrated as an example. The substrate 100 includes a hole 132 which extends from the surface 100a toward the surface 100b of the substrate 100. In one embodiment, the hole 132 exposes a portion of the conducting pad structure 104. In addition, the conducting layer 102 extends overlying the sidewall of the hole 132 and the surface 100a of the substrate 100, and is electrically connected to the conducting pad structure 104. The material of the conducting layer 102 may, for example, be (but is not limited to) a metal material such as copper, aluminum, gold, or combinations thereof. It should be appreciated that if the material of the substrate 100 is electrically conductive, it is necessary to form an insulating layer between the conducting layer 102 and the substrate 100 to prevent short circuiting from occurring. For example, in the embodiment shown in FIG. 1A, an insulating layer 130 may be optionally formed between the substrate 100 and the conducting layer 102. Similarly, an insulating layer may be formed between the substrate 100 and another conducting structure, depending on the situation.

As shown in FIG. 1A, a passivation layer 106 is disposed overlying the surface 100a and the conducting layer 102. The passivation layer 106 may include, for example, (but is not limited to) a solder mask material, polyimide, or green paint. At least an opening 108 is defined in the passivation layer 106, which exposes a portion of the conducting layer 102.

Then, as shown in FIG. 1B, a light shielding layer 110 is formed overlying the surface 100a of the substrate 100. In this embodiment, the light shielding layer 110 is formed overlying the passivation layer 106. The material of the light shielding layer 110 may be, for example, a polymer material or a combination of a metal material layer and an insulating layer. In one embodiment, the light shielding layer 110 is a photoresist layer for convenience when being patterned. For example, the light shielding layer 110 may be a black photoresist layer. In one embodiment, the light shielding layer 110 is a negative photoresist layer. In one embodiment, the light shielding layer 110 may be formed overlying the substrate by, for example, an application process, followed by a patterning process, for example, as shown in FIG. 1B. The light shielding layer 110 may help to block light coming from the outside of the chip package, especially light behind the surface 100a of the substrate 100. Thus, operation of the optical device 101 may be improved. For example, when the optical device 101 is an image sensor device, the light shielding layer 110 may block light coming from the surface 100a of the substrate 100 to prevent noise of the image signals. Alternatively, when the optical device 101 is a light emitting device, the light shielding layer 110 may block the light coming from the surface 100a of the substrate 100 to prevent the wavelength and/or the intensity of the light emitted by the chip package from being affected by the light outside of the chip package.

Then, as shown in FIG. 1C, a conducting bump 112 is disposed overlying the surface 100a of the substrate 100. In one embodiment, an under bump metallurgy layer 112a may be optionally formed overlying the conducting layer 102 before the conducting bump 112 is formed. The under bump metallurgy layer 112a may extend along the sidewall of the opening 108 of the passivation layer 106 and further extend overlying the light shielding layer 110 on the passivation layer 106. Then, the conducting bump 112 may be disposed on the opening 108 of the passivation layer 106.

As shown in FIG. 1C, the conducting bump 112 includes a bottom portion 113a and an upper portion 113b. The bottom portion 113a fills the opening 108 of the passivation layer 106 and electrically contacts the exposed conducting layer 102. The upper portion 113b of the conducting bump 112 is located outside of the opening 108 of the passivation layer 106 and extends along a direction away from the opening 108. For example, the upper portion 113b of the conducting bump 112 extends outward from the periphery of the opening 108 along a substantially horizontal direction, such that the upper portion 113b is at least partially located on the light shielding layer 110 and overlaps the under bump metallurgy layer 112a and the underlying light shielding layer 110.

In other words, in one embodiment, a chip package includes a recess 114 which extends from a surface of the conducting bump 112 toward an inner portion of the conducting bump 112. The light shielding layer 110 disposed on the surface 100a extends under the upper portion 113b of the conducting bump 112 and is partially located in the recess 114. Because the light shielding layer 110 extends into the recess 114 of the conducting bump 112, outside light coming from the surface 100a may be blocked more effectively, preventing light or noise signals from being transmitted to the optical device 101 located on the surface 100b. In addition, in one embodiment, the recess 114 has a sidewall 114a which has a substantially conformal and planar surface and is substantially parallel to the surface 100a of the substrate 100.

In the embodiment shown in FIG. 1C, the passivation layer 106 extends under the upper portion 113b of the conducting bump 112 and overlaps a portion of the conducting bump 112. In one embodiment, the portion of the conducting bump 112 overlapping the passivation layer 106 is larger than the portion of the conducting bump 112 overlapping the light shielding layer 110.

In the embodiment shown in FIG. 1C, another material layer such as the under bump metallurgy layer 112a may be located between the light shielding layer 110 and the conducting bump 112. In this case, the light shielding layer 110 directly contacts the under bump metallurgy layer 112a. In addition, in one embodiment, the light shielding layer 110 does not directly contact the conducting layer 102 but the passivation layer 106, for example, is interposed therebetween.

Figure 2A:
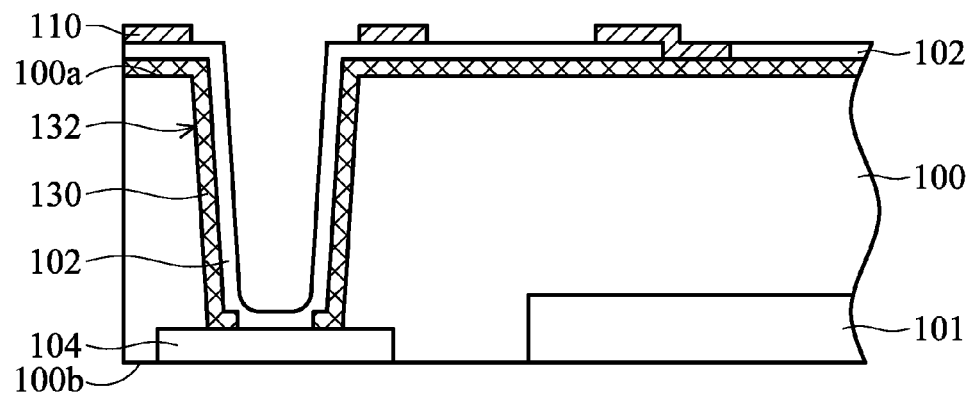
FIGS. 2A-2C are cross-sectional views showing the steps of forming a chip package in accordance with an embodiment of the present invention.
Figure 2B:
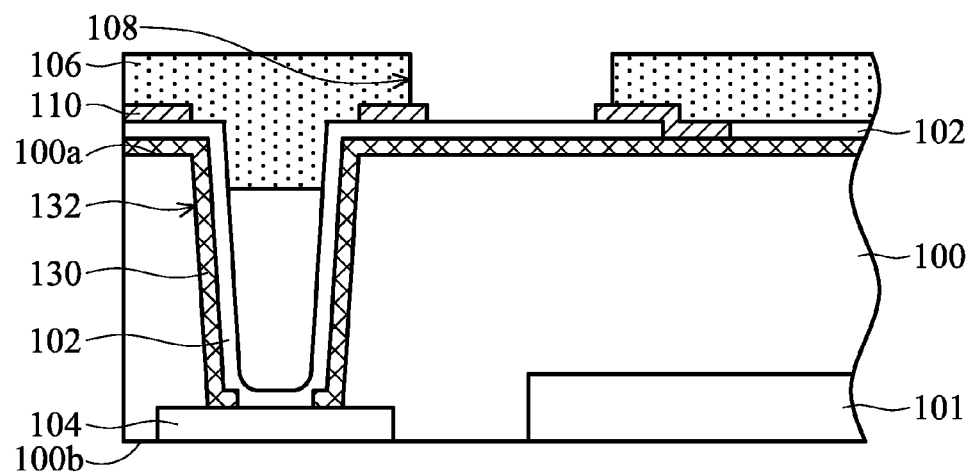
Figure 2C:
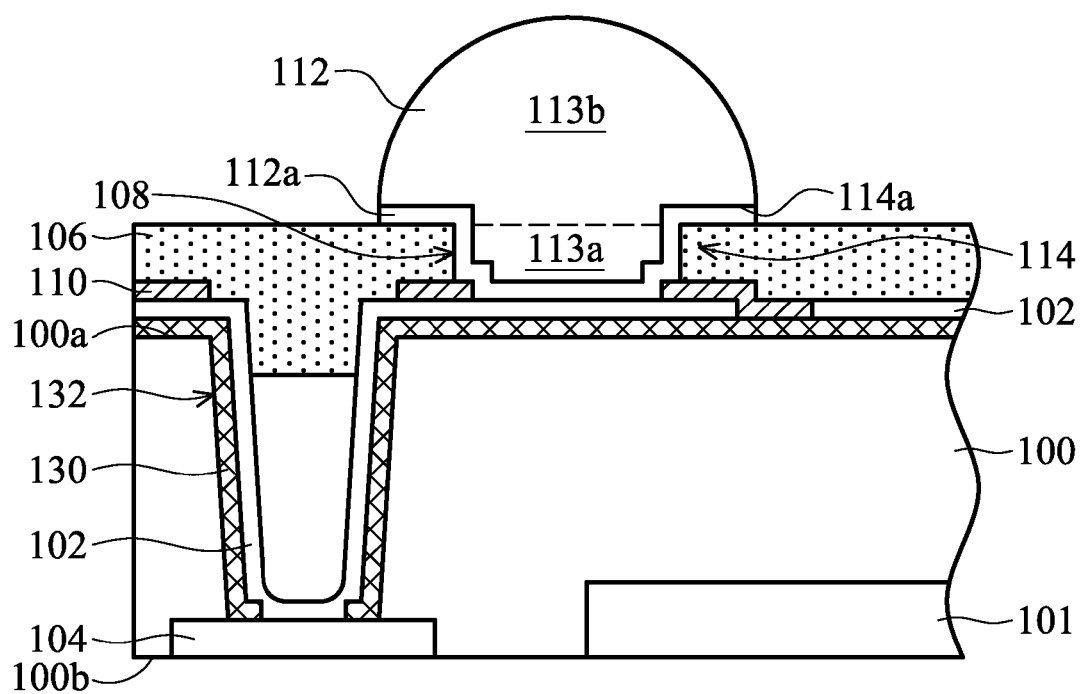

FIGS. 2A-2C are cross-sectional views showing the steps of forming a chip package according to another embodiment of the present invention, wherein same or similar reference numbers are used to designate same or similar elements. Further, some elements and their materials and fabrication methods are substantially similar to the embodiment shown in FIG. 1, and thus are not repeatedly illustrated.

As shown in FIG. 2A, in one embodiment, before a passivation layer is formed, the light shielding layer 110 is formed overlying the surface 100a of the substrate 100. For example, the light shielding layer 110 may extend overlying the conducting layer 102. In one embodiment, the light shielding layer directly contacts the conducting layer. However, it should be appreciated that embodiments of the invention are not limited thereto. In another embodiment, the light shielding layer may be formed only on the surface 100a but not extending overlying the conducting layer 102 without directly contacting the conducting layer 102. Alternatively, although the light shielding layer 110 extends overlying the conducting layer 102, another material layer may be formed therebetween such that the light shielding layer 110 and the conducting layer 110 do not directly contact with each other. In one embodiment, the light shielding layer 110 is patterned to have at least an opening which exposes at least a portion of the conducting layer 102.

Then, as shown in FIG. 2B, a passivation layer 106 is formed overlying the surface 100a of the substrate 100. The passivation layer 106 is patterned such that only a portion of the light shielding layer 110 and a portion of the conducting layer 102 are covered. In the embodiment shown in FIG. 2B, the passivation layer 106 covers a portion of the light shielding layer 110, and the opening 108 of the passivation layer 106 exposes another portion of the light shielding layer 110.

Then, as shown in FIG. 2C, the conducting bump 112 is formed on the conducting layer 102 exposed by the opening 108 of the passivation layer 106, and the under bump metallurgy layer 112a may be optionally formed between the conducting bump 112 and the conducting layer 102. The conducting bump 112 includes the bottom portion 113a, disposed in the opening 108 of the passivation layer 106, and the upper portion 113b, disposed on the outside of the opening 108. In addition, the conducting bump 112 also includes a recess 114 extending from the surface of the conducting bump 112 toward the inner portion of the conducting bump 112. The light shielding layer 110 extends under the upper portion 113b and is partially located in the recess 114. Thus, light or noise signals may be effectively blocked from being transmitted to the optical device 101 so that operation thereof is not affected.

In the embodiment shown in FIG. 2C, the passivation layer 106 extends under the upper portion 113b of the conducting bump 112 and overlaps a portion of the conducting bump 112. In one embodiment, the portion of the conducting bump 112 overlapping the passivation layer 106 is smaller than the portion of the conducting bump 112 overlapping the light shielding layer 110.

Figure 3A:
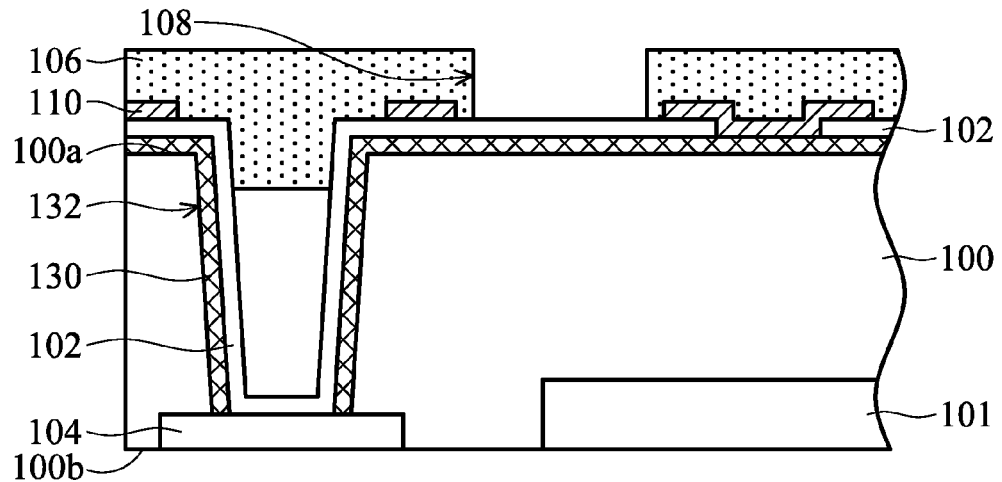
FIGS. 3A-3B are cross-sectional views showing the steps of forming a chip package in accordance with an embodiment of the present invention.
Figure 3B:
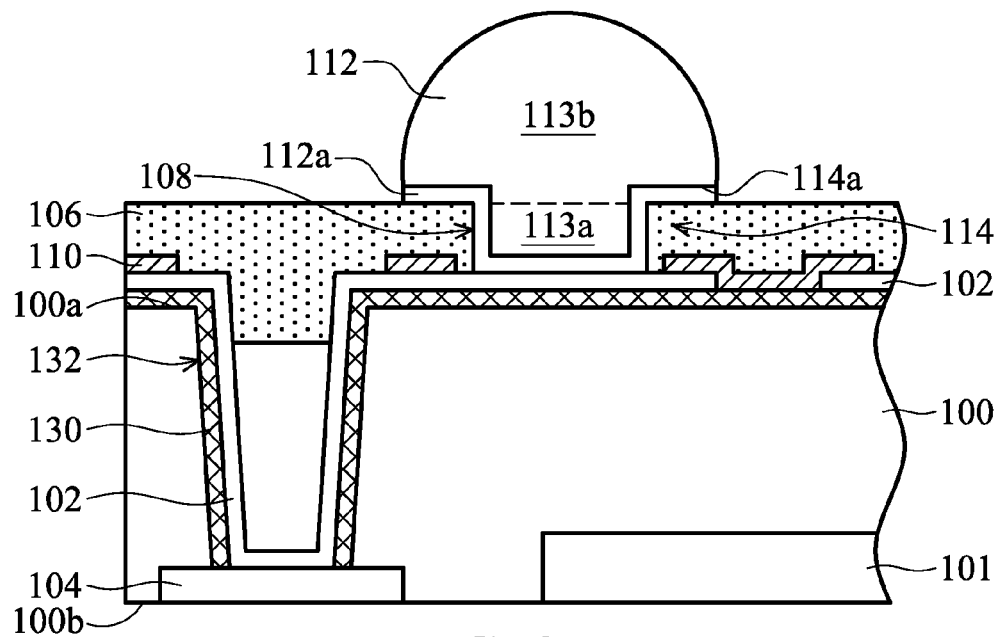

FIGS. 3A-3B are cross-sectional views showing the steps of forming a chip package according to yet another embodiment of the present invention, wherein same or similar reference numbers are used to designate same or similar elements. Further, some elements and their materials and fabrication methods are substantially similar to the embodiment shown in FIG. 1, and thus are not repeatedly illustrated.

As shown in FIG. 3A, in one embodiment, before a passivation layer is formed, the light shielding layer 110 is formed overlying the surface 100a of the substrate 100. For example, the light shielding layer 110 may extend overlying the conducting layer 102. The light shielding layer 110 is patterned to have at least an opening which exposes at least a portion of the conducting layer 102.

Then, the passivation layer 106 is formed overlying the surface 100a of the substrate 100. The passivation layer 106 is patterned so that a portion of the conducting layer 102 is exposed from the opening 108. In the embodiment shown in FIG. 3A, the passivation layer 106 completely and substantially covers the light shielding layer 110 on the conducting layer 102.

Then, as shown in FIG. 3B, the conducting bump 112 is formed on the conducting layer 102 exposed by the opening 108 of the passivation layer 106, and the under bump metallurgy layer 112a may be optionally formed between the conducting bump 112 and the conducting layer 102. The conducting bump 112 includes the bottom portion 113a disposed in the opening 108 of the passivation layer 106 and the upper portion 113b outside of the opening 108. In addition, the conducting bump 112 also includes a recess 114 extending from the surface of the conducting bump 112 toward the inner portion of the conducting bump 112. The light shielding layer 110 extends under the upper portion 113b and is partially located in the recess 114. Thus, light or noise signals may be effectively blocked from being transmitted to the optical device 101 and affecting its operation.

In the embodiment shown in FIG. 3B, the passivation layer 106 extends under the upper portion 113b of the conducting bump 112 and overlaps a portion of the conducting bump 112. In one embodiment, the portion of the conducting bump 112 overlapping the passivation layer 106 is larger than the portion of the conducting bump 112 overlapping the light shielding layer 110. In addition, because the passivation layer 106 completely covers the light shielding layer 110 on the conducting layer 102 and is located between the conducting bump 112 and the light shielding layer 110, the light shielding layer does not directly contact the conducting bump. If under bump metallurgy layer 112a is formed, the light shielding layer 110 does not directly contact the under bump metallurgy layer 112a.

Figure 4A:
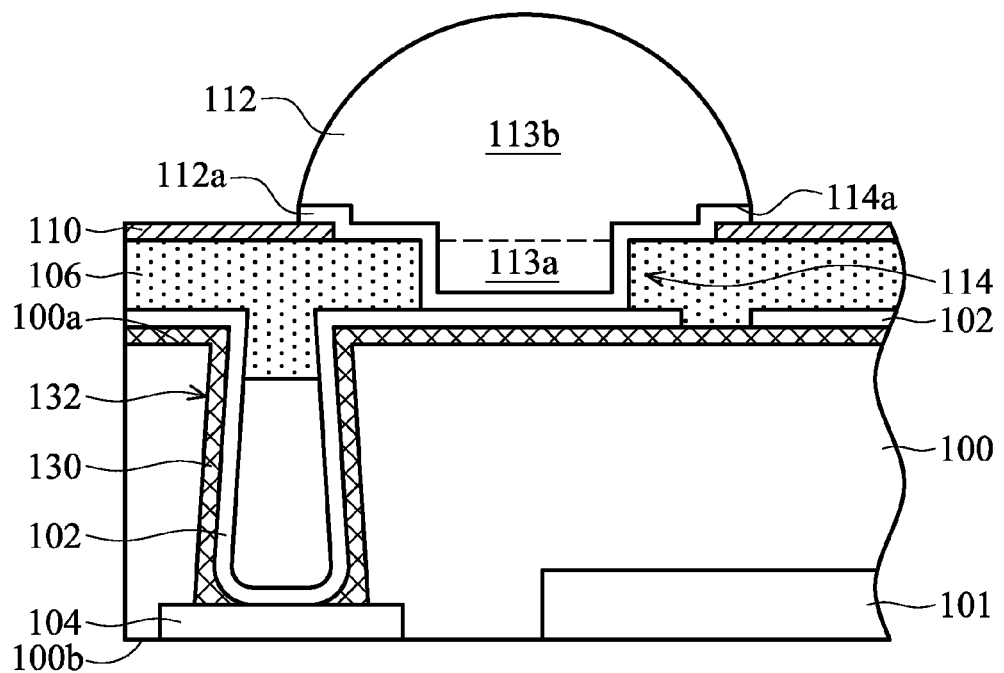
FIGS. 4A-4C are cross-sectional views showing the steps of forming a chip package in accordance with an embodiment of the present invention.
Figure 4B:
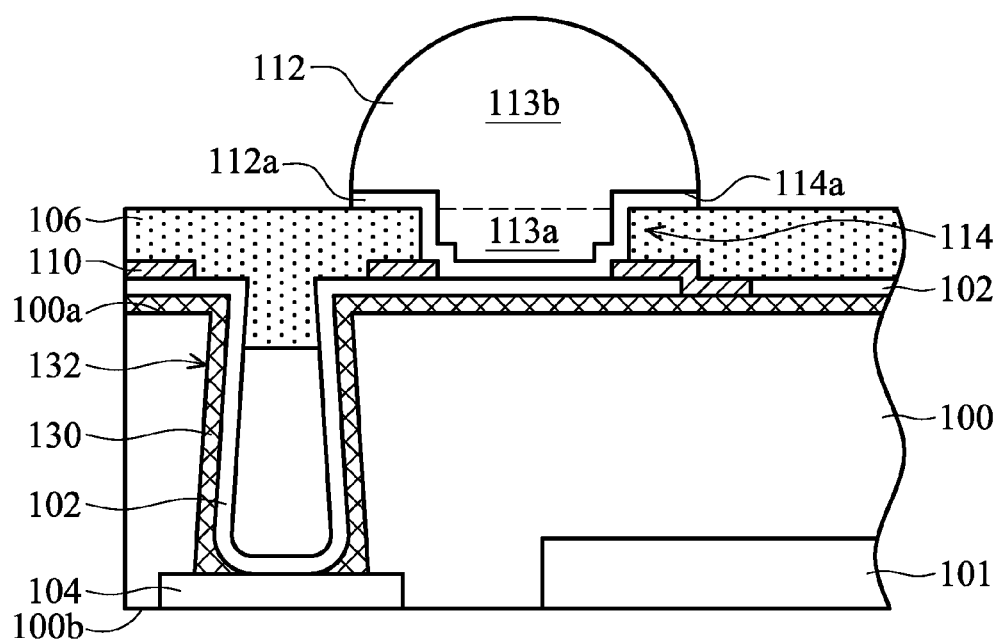
Figure 4C:
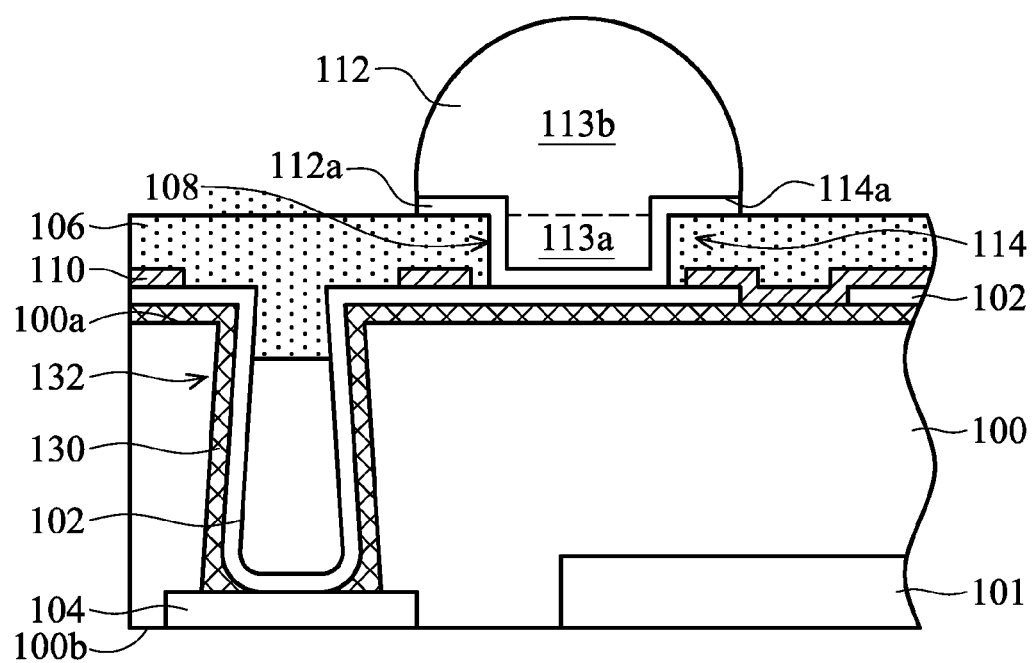

FIGS. 4A-4C are cross-sectional views showing the steps of forming a chip package according to yet another embodiment of the present invention, wherein same or similar reference numbers are used to designate same or similar elements. Further, some elements and their materials and fabrication methods are substantially similar to the embodiments shown in FIGS. 1-3, and thus are not repeatedly illustrated.

In the chip package in FIG. 4, the through-substrate conducting structure may have other variations. In the embodiment shown in FIGS. 4A-4C, the hole 132 has an "inverted angle structure". That is, the upper opening of the hole 132 (the opening near the surface 100a) has a width smaller than the lower opening of the hole (the opening near the surface 100b). In some embodiments, forming the hole 132 having the "inverted angle structure" will make fabrication during subsequent processes more efficient. In the embodiment shown in FIGS. 4A-4C, the light shielding layer 110 is not located in the hole 132. Thus, reliability of the chip package may be improved.

Figure 6A:
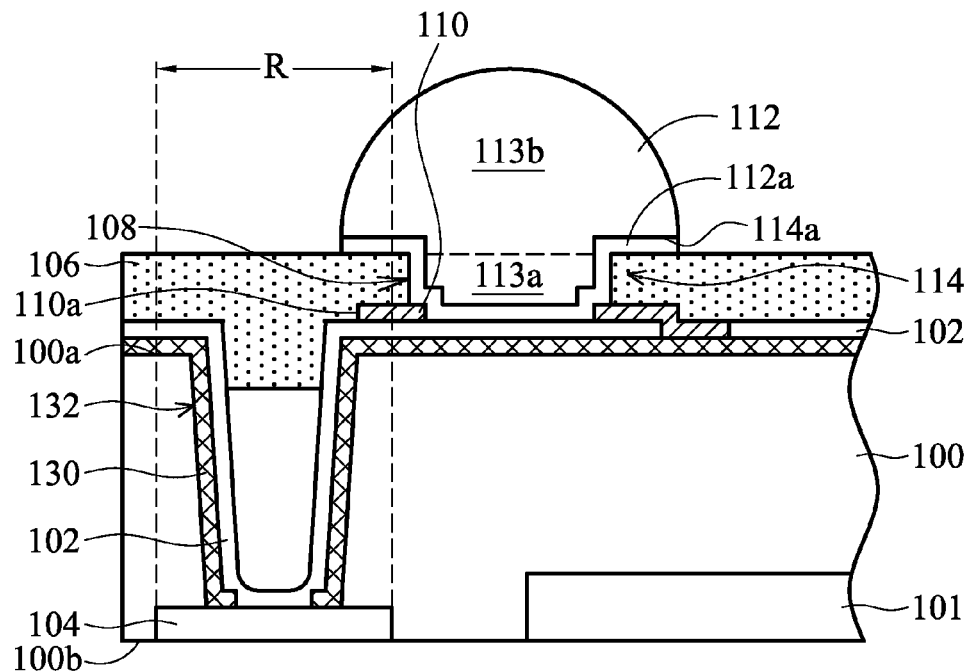
FIGS. 6A-6B are cross-sectional views respectively showing a chip package in accordance with embodiments of the present invention.
Figure 6B:
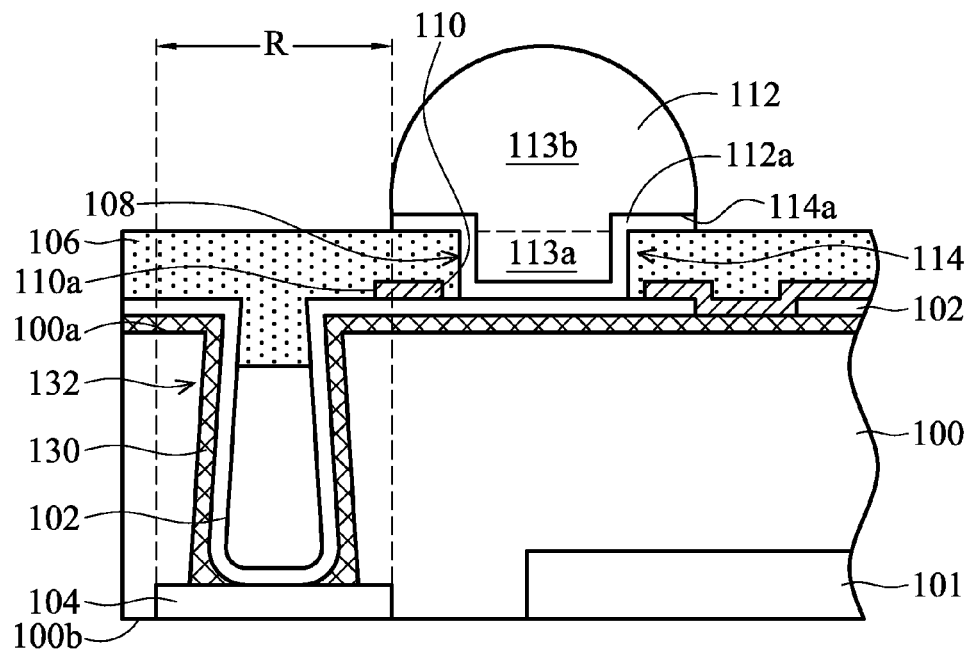
Figure 7A:
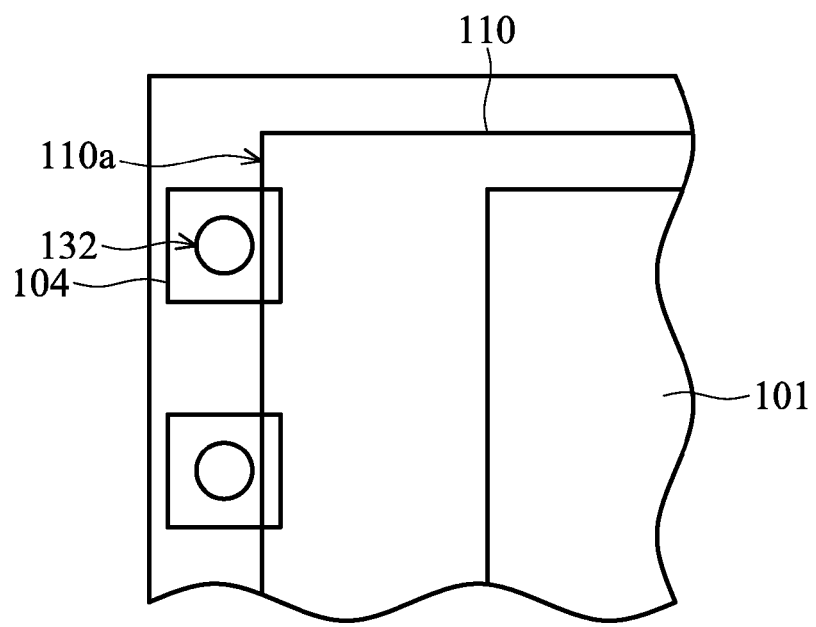
FIGS. 7A-7B are illustrative perspective top views respectively showing a chip package in accordance with embodiments of the present invention.
Figure 7B:
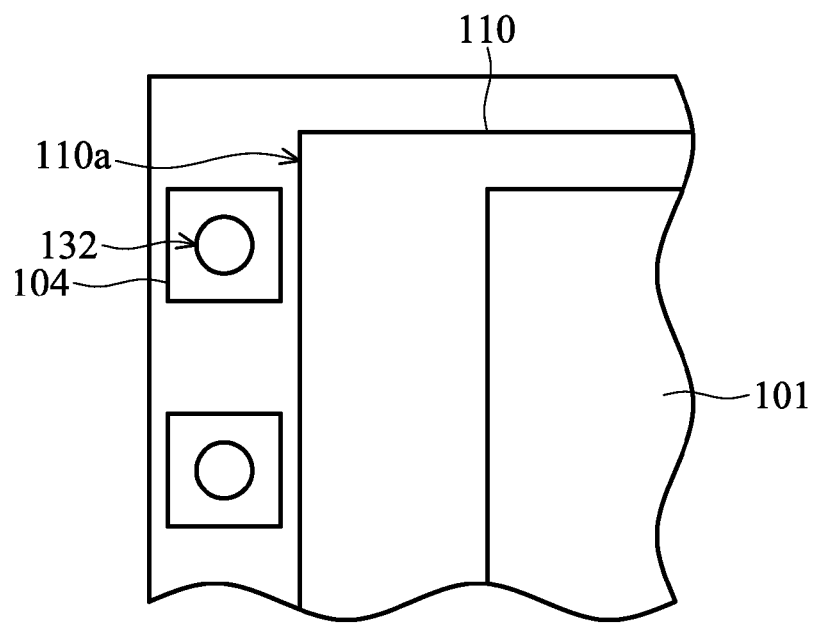

FIGS. 6A-6B are cross-sectional views respectively showing a chip package in accordance with embodiments of the present invention, wherein similar or same reference numbers are used to designate similar or same elements. FIGS. 7A-7B are illustrative perspective top views respectively showing a chip package in accordance with embodiments of the present invention.

FIG. 6A shows a chip package according to an embodiment of the invention, which is similar to that shown in FIG. 2C. However, the main difference is that the light shielding layer 110 of the embodiment shown in FIG. 6A has a side edge 110a between the hole 132 and the optical device 101. In this embodiment, the side edge 110a of the light shielding layer 110 is located within a region R which is in a direct projection region of the conducting pad structure 104 on the surface 100a. In this case, as shown in FIG. 7A, the shielding layer 110 overlaps a portion of the conducting pad structure 104. The side edge 110a of the light shielding layer 110 is located between the optical device 101 and the hole 132 and further located within the region R.

Similarly, FIG. 6B shows a chip package according to an embodiment of the invention, which is similar to that shown in FIG. 4C. The main difference is that the light shielding layer 110 of the embodiment shown in FIG. 6B has a side edge 110a between the hole 132 and the optical device 101. In this embodiment, the side edge 110a of the light shielding layer 110 is located within a region R which is in a direct projection region of the conducting pad structure 104 on the surface 100a. In this case, as shown in FIG. 7A, the shielding layer 110 overlaps a portion of the conducting pad structure 104. The side edge 110a of the light shielding layer 110 is located between the optical device 101 and the hole 132 and further located within the region R.

It should be appreciated, however, that embodiments of the present invention are not limited thereto. In another embodiment, the side edge 110a of the light shielding layer 110 may not be located within the direct projection region of the conducting pad structure 104 on the surface 100a. Referring to FIG. 7B, in this embodiment, the side edge 110a of the light shielding layer 110 is located between the optical device 101 and the hole 132 without overlapping the conducting pad structure 104 thereunder.

As mentioned above, in the chip package according to an embodiment of the invention, the light shielding layer is located on a surface of the substrate and further extends into the recess of the conducting bump and has a relatively larger portion overlapping the conducting bump. Thus, the optical device of the chip package may operate more accurately without being affected by light or noise signals.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package, comprising:
a substrate having a first surface and a second surface of the substrate;
an optical device disposed on the first surface of the substrate;
a conducting layer located on the second surface of the substrate and electrically connected to the optical device;
a passivation layer disposed on the second surface of the substrate and the conducting layer, wherein the passivation layer has an opening exposing the conducting layer;
a conducting bump disposed on the second surface of the substrate, wherein the conducting bump has a bottom portion and an upper portion, and the bottom portion of the conducting bump is disposed in the opening and electrically contacts the exposed conducting layer, and the upper portion of the conducting bump is located outside of the opening and extends along a direction away from the opening;
a recess extending from a surface of the conducting bump toward an inner portion of the conducting bump; and
a light shielding layer disposed on the second surface of the substrate, extending under the upper portion of the conducting bump, and partially located in the recess and overlapping a portion of the conducting bump.

2. The chip package as claimed in claim 1, wherein a portion of the light shielding layer is located between the conducting bump and the passivation layer.

3. The chip package as claimed in claim 1, wherein a portion of the light shielding layer is located between the conducting bump and the conducting layer.

4. The chip package as claimed in claim 1, wherein a portion of the passivation layer is located between the conducting bump and the light shielding layer.

5. The chip package as claimed in claim 1, wherein the light shielding layer does not directly contact the conducting bump.

6. The chip package as claimed in claim 1, further comprising an under bump metallurgy layer located between the conducting bump and the conducting layer and located between the conducting bump and the light shielding layer.

7. The chip package as claimed in claim 6, wherein a portion of the light shielding layer directly contacts the under bump metallurgy layer.

8. The chip package as claimed in claim 6, wherein the light shielding layer does not directly contact the under bump metallurgy layer.

9. The chip package as claimed in claim 1, wherein the light shielding layer comprises a negative photoresist.

10. The chip package as claimed in claim 6, wherein the light shielding layer is at least comprises a metal material layer and an insulating layer and the insulating layer is at least located between the metal material layer and the under bump metallurgy layer or is at least located between the metal material layer and the conducting layer.

11. The chip package as claimed in claim 1, further comprising a hole extending from the second surface toward the first surface, wherein the conducting layer extends overlying a sidewall of the hole.

12. The chip package as claimed in claim 11, wherein the light shielding layer is not located in the hole.

13. The chip package as claimed in claim 1, wherein the passivation layer extends under the upper portion of the conducting bump and overlaps a portion of the conducting bump.

14. The chip package as claimed in claim 13, wherein the portion of the conducting bump overlapping the passivation layer is larger than a portion of the conducting bump overlapping the light shielding layer.

15. The chip package as claimed in claim 13, wherein the portion of the conducting bump overlapping the passivation layer is smaller than a portion of the conducting bump overlapping the light shielding layer.

16. The chip package as claimed in claim 1, wherein a sidewall of the recess has a substantially planar surface substantially parallel to the second surface of the substrate.

17. The chip package as claimed in claim 1, wherein the light shielding layer does not directly contact the conducting layer.

18. The chip package as claimed in claim 1, wherein the light shielding layer directly contacts the conducting layer.

19. The chip package as claimed in claim 11, wherein the light shielding layer has a side edge located between the hole and the optical device.

20. The chip package as claimed in claim 19, wherein the side edge of the light shielding layer is located within a direct projection region of a conducting pad structure on the second surface.

* * * * *